(12) United States Patent
Lee et al.

(10) Patent No.: US 8,519,549 B2
(45) Date of Patent: Aug. 27, 2013

(54) ANISOTROPIC CONDUCTIVE FILM AND DISPLAY DEVICE HAVING THE SAME

(75) Inventors: Jung-Min Lee, Yongin (KR); Choong-Ho Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 247 days.

(21) Appl. No.: 12/889,290

(22) Filed: Sep. 23, 2010

(65) Prior Publication Data

US 2011/0079799 A1     Apr. 7, 2011

(30) Foreign Application Priority Data

Oct. 5, 2009    (KR) .................. 10-2009-0094384

(51) Int. Cl.
*H01L 23/48*     (2006.01)
*H01L 23/52*     (2006.01)
*H01L 29/40*     (2006.01)

(52) U.S. Cl.
USPC .................................. 257/783; 257/E23.018

(58) Field of Classification Search
USPC .................. 257/778, E21.503, 773, 774, 692, 257/59, 88, 781, 756, E23.027, 91, 780, 779, 257/E21.508, 791, 789, 783, E23.018, E23.166, 257/E21.514
See application file for complete search history.

(56) References Cited

U.S. PATENT DOCUMENTS

| | | | | |
|---|---|---|---|---|
| 4,740,657 A | * | 4/1988 | Tsukagoshi et al. | 174/88 R |
| 5,324,565 A | * | 6/1994 | Leonida et al. | 428/131 |
| 6,352,775 B1 | * | 3/2002 | Sasaki et al. | 428/403 |
| 6,906,427 B2 | * | 6/2005 | Tanaka et al. | 257/778 |
| 7,413,686 B2 | * | 8/2008 | Yamada | 252/512 |
| 7,492,434 B2 | | 2/2009 | Kudo et al. | |
| 2006/0072060 A1 | * | 4/2006 | Lu et al. | 349/151 |
| 2006/0286721 A1 | * | 12/2006 | Lu et al. | 438/119 |
| 2007/0024795 A1 | * | 2/2007 | Kim | 349/152 |
| 2007/0030433 A1 | | 2/2007 | Kudo et al. | |
| 2007/0035239 A1 | * | 2/2007 | Kang et al. | 313/504 |
| 2007/0076393 A1 | * | 4/2007 | Jeong et al. | 361/767 |
| 2007/0116961 A1 | * | 5/2007 | Connell et al. | 428/413 |
| 2008/0099733 A1 | | 5/2008 | Kim et al. | |
| 2008/0123041 A1 | * | 5/2008 | Fujita | 349/152 |
| 2008/0237545 A1 | * | 10/2008 | Kim et al. | 252/500 |

FOREIGN PATENT DOCUMENTS

| | | |
|---|---|---|
| JP | 2004-196889 | 7/2004 |
| KR | 100718726 B1 | 5/2007 |
| KR | 10-2007-0098369 | 10/2007 |

\* cited by examiner

*Primary Examiner* — Matthew Landau
*Assistant Examiner* — Latanya N Crawford
(74) *Attorney, Agent, or Firm* — Knobbe Martens Olson & Bear LLP

(57) ABSTRACT

An anisotropic conductive film (ACF) is disclosed. The ACF includes a film, an adhesive layer positioned on the film, and one or more conductive balls within the adhesive layer. The conductive balls include a first core part having a first hardness, a second core part covering the first core part and having a second hardness that is greater than the first hardness, and a conductive part covering the second core part, respectively.

12 Claims, 16 Drawing Sheets

FIG.4

| Shore A | G Modulus[N/mm²] | C10[N/mm²] | C01[N/mm²] |
|---|---|---|---|
| 35 | 0.406 | 0.162 | 0.041 |
| 36 | 0.407 | 0.163 | 0.041 |
| 37 | 0.412 | 0.165 | 0.041 |
| 38 | 0.421 | 0.168 | 0.042 |
| 39 | 0.435 | 0.174 | 0.044 |
| 40 | 0.452 | 0.181 | 0.045 |
| 41 | 0.473 | 0.189 | 0.047 |
| 42 | 0.496 | 0.198 | 0.050 |
| 43 | 0.523 | 0.209 | 0.052 |
| 44 | 0.551 | 0.220 | 0.055 |
| 45 | 0.581 | 0.232 | 0.058 |
| 46 | 0.613 | 0.245 | 0.061 |
| 47 | 0.647 | 0.259 | 0.065 |
| 48 | 0.682 | 0.273 | 0.068 |
| 49 | 0.718 | 0.287 | 0.072 |
| 50 | 0.755 | 0.302 | 0.076 |
| 51 | 0.793 | 0.317 | 0.079 |
| 52 | 0.832 | 0.333 | 0.083 |

| Shore A | G Modulus[N/mm²] | C10[N/mm²] | C01[N/mm²] |
|---|---|---|---|
| 53 | 0.872 | 0.349 | 0.087 |
| 54 | 0.914 | 0.366 | 0.091 |
| 55 | 0.956 | 0.382 | 0.096 |
| 56 | 0.999 | 0.400 | 0.100 |
| 57 | 1.043 | 0.417 | 0.104 |
| 58 | 1.809 | 0.436 | 0.109 |
| 59 | 1.136 | 0.454 | 0.114 |
| 60 | 1.185 | 0.474 | 0.118 |
| 61 | 1.236 | 0.494 | 0.124 |
| 62 | 1.289 | 0.516 | 0.129 |
| 63 | 1.345 | 0.538 | 0.135 |
| 64 | 1.403 | 0.561 | 0.140 |
| 65 | 1.465 | 0.586 | 0.147 |
| 66 | 1.531 | 0.612 | 0.153 |
| 67 | 1.600 | 0.640 | 0.160 |
| 68 | 1.675 | 0.670 | 0.168 |
| 69 | 1.754 | 0.702 | 0.175 |
| 70 | 1.839 | 0.736 | 0.184 |

FIG.13
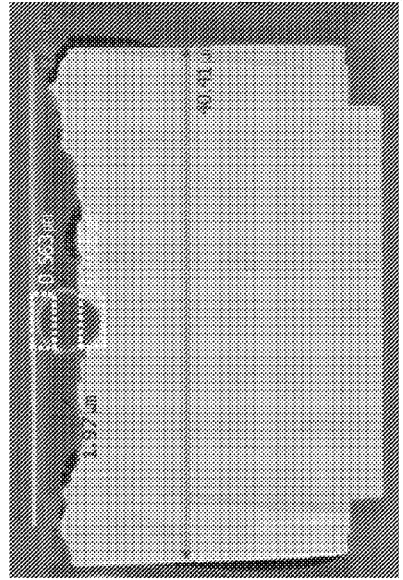
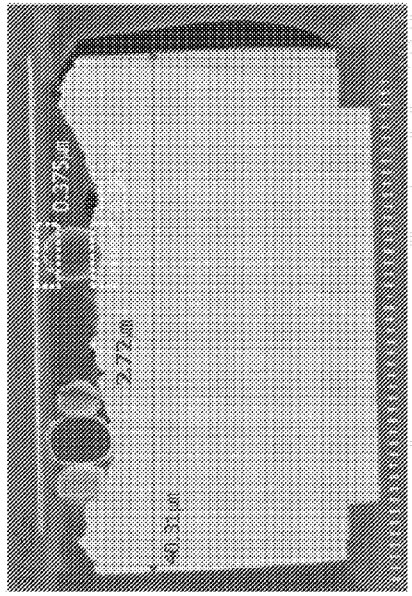
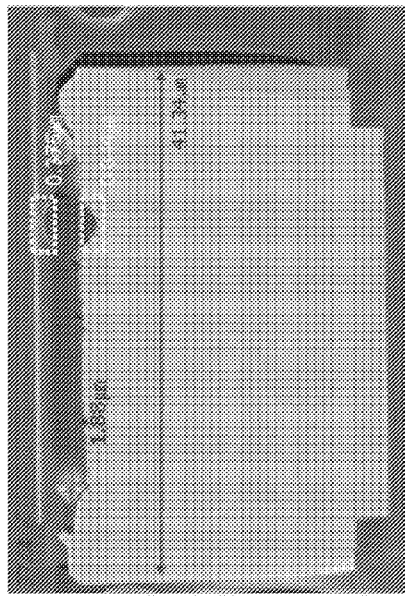

FIG.15

Simulation

| Nominal P (MPa) | Real P (MPa) | δ (um) | bump (um) | pad (um) | Real P/Nominal P (%) |
|---|---|---|---|---|---|
| 65 | 19.5 | 2.4 | 0.56 | 0.29 | 30 |
| 70 | 21.7 | 2.1 | 0.71 | 0.34 | 31 |
| 75 | 24.0 | 2.0 | 0.83 | 0.38 | 32 |
| 80 | 26.8 | 1.8 | 0.90 | 0.45 | 33.5 |
| 85 | 30.0 | 1.6 | 0.96 | 0.53 | 35 |

Test

| | δ (nm) | bump (um) | pad (um) |
|---|---|---|---|
| 65 MPa | 2.7 | 0.56 | 0.30 |
| 75 MPa | 1.9 | 0.84 | 0.38 |
| 85 MPa | 2.0 | 0.94 | 0.56 |

US 8,519,549 B2

ANISOTROPIC CONDUCTIVE FILM AND DISPLAY DEVICE HAVING THE SAME

CROSS-REFERENCE TO RELATED APPLICATIONS

This application claims priority to and the benefit of Korean Patent Application No. 10-2009-0094384 filed in the Korean Intellectual Property Office on Oct. 5, 2009, the entire contents of which are incorporated herein by reference.

BACKGROUND

1. Field

The field relates generally to an anisotropic conductive film, and more particularly, to an anisotropic conductive film for mounting an integrated circuit (IC) chip thereon and a display device having the same.

2. Description of the Related Technology

A display device is a device for displaying images, and recently, an organic light emitting diode (OLED) display has received much attention.

The OLED display has self-emission characteristics, so, unlike a liquid crystal display (LCD), the OLED display can be formed to be thinner and lighter without the necessity of a light source. In addition, the OLED has high quality characteristics such as low power consumption, high luminance, and a high response speed.

The OLED display can be manufactured by forming elements on a substrate made of glass or plastic, and integrated circuit (IC) chips for generating various signals to operate the display device may be mounted on a certain region of the substrate forming the display device. In this case, the display device may be classified as a chip-on-glass (COG) type, a chip on flexible printed circuit board (FPCB) (COF) type, and the like, depending on the substrate. Here, the COG refers to mounting the IC chips on the substrate, and the COF refers to mounting the IC chips on a film such as polyimide and the like.

In the case of the COG with the IC chips mounted on the substrate, an anisotropic conductive film (ACF) is interposed between a pad formed on the substrate and a terminal of the IC chip. In this case, a direct connection between the pad of the substrate and the terminal of the IC chip is made by conductive balls included in the ACF, and attachment between the substrate and the IC chip is made by an adhesive layer that is included in the ACF and covers the conductive balls. The conductive balls, which are compressed between the pad of the substrate and the terminal of the IC chip, have good power of restitution. Consequently, the contact area between the pad and the terminal increase according to pressure between the pad and the terminal. Accordingly, contact resistance between the conductive balls and the pad and that between the conductive balls and the terminal are lowered as the pressure applied to the conductive balls increases.

In this respect, however, if pressure of more than a certain level is applied to the conductive balls, the power of restitution of the compressed conductive balls would exceed the fixing capability limit of the adhesive layer that attaches the substrate and the IC chip. Then, the adhesive layer would fail to properly fix the compressed form of the conductive balls, allowing the conductive balls to be restored in their form to increase the contact resistance between the conductive balls and the pad and the contact resistance between the conductive balls and the terminal.

The above information disclosed in this Background section is only for enhancement of understanding of the background of the described technology and therefore it may contain information that does not form prior art that is already known in this country to a person of ordinary skill in the art.

SUMMARY OF CERTAIN INVENTIVE ASPECTS

One aspect is an anisotropic conductive film (ACF) including a film, an adhesive layer on the film, and one or more conductive balls within the adhesive layer, where each of the conductive balls includes a first core part having a first hardness, a second core part covering the first core part and having a second hardness that is greater than the first hardness, and a conductive part covering the second core part.

Another aspect is a display device including a wiring substrate having a wiring part, and a pad part on the wiring substrate, where the pad part extends from the wiring part. The display device also has an integrated circuit (IC) chip connected with the pad part, and an anisotropic conductive film (ACF) mounting the IC chip to the pad part, where the ACF includes an adhesive layer positioned between the pad part and the IC chip and one or more conductive balls within the adhesive layer and connecting the pad part to the IC chip. Each of the conductive balls includes a first core part having a first hardness, a second core part covering the first core part and having a second hardness that is greater than the first hardness, and a conductive part covering the second core part.

Another aspect is an anisotropic conductive film (ACF) including a film, an adhesive layer positioned on the film, and one or more conductive balls dispersed within the adhesive layer, where each of the conductive balls includes a core part containing rubber having hardness of about 30 to about 70 as Shore hardness type A, and a conductive part covering the core part.

Another aspect is a display device including a wiring substrate having a wiring part, and a pad part on the wiring substrate, where the pad part extends from the wiring part. The display device also has an integrated circuit (IC) chip connected with the pad part, and an anisotropic conductive film (ACF) mounting the IC chip to the pad part, where the ACF includes an adhesive layer positioned between the pad part and the IC chip and one or more conductive balls within the adhesive layer and connecting the pad part to the IC chip, where each of the conductive balls includes a core part containing rubber having hardness of about 30 to about 70 as the Shore hardness type A and a conductive part being in contact with the pad part and the IC chip.

BRIEF DESCRIPTION OF THE DRAWINGS

FIG. 4 shows a table of hardness of Shore hardness type A.

FIGS. 13 to 15 show results of experimentation and simulation using a conventional conductive ball.

DETAILED DESCRIPTION OF CERTAIN INVENTIVE EMBODIMENTS

Figure 1:
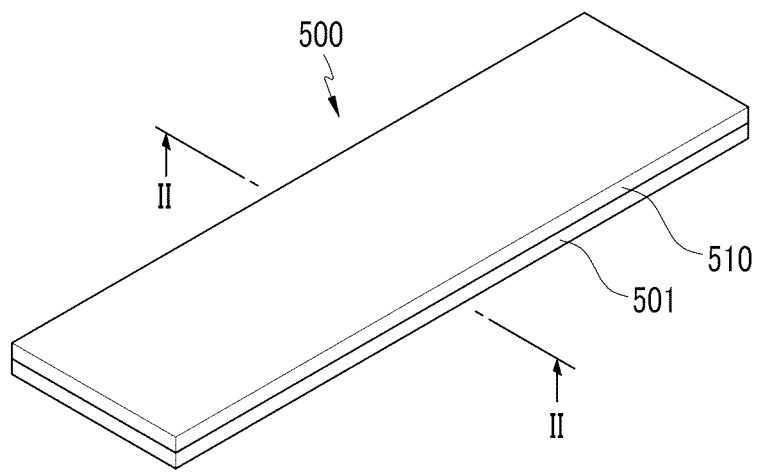
FIG. 1 is a perspective view of an anisotropic conductive film (ACF) according to a one embodiment.

The present invention will be described more fully hereinafter with reference to the accompanying drawings, in which exemplary embodiments of the invention are shown. As those skilled in the art would realize, the described embodiments may be modified in various different ways, without departing from the spirit or scope of the present invention.

In order to clarify the present invention, the same elements or equivalents are generally referred to by the same reference numerals throughout the specification.

The size and thickness of each element are arbitrarily shown in the drawings, and the present invention is not necessarily limited thereto.

In the drawings, the thickness of layers, films, panels, regions, etc., are exaggerated for clarity. Also, in the drawings, the thickness of some layers and regions are exaggerated for the sake of brevity. It will be understood that when an element such as a layer, film, region, or substrate is referred to as being "on" another element, it can be directly on the other element or intervening elements may also be present.

In the following description, an organic light emitting diode (OLED) display including an organic light emission layer will be taken as an example, but without being limited thereto, the display device according to an exemplary embodiment may be a liquid crystal display (LCD), a plasma display panel (PDP), a field emission display, and the like.

In the accompanying drawings, an active matrix (AM) type OLED display with a 2Tr-1Cap structure in which a single pixel has two thin film transistors (TFTs) and one storage capacitor is illustrated, but the present invention is not meant to be limited thereto. Namely, in the OLED display, the number of TFTs, the number of storage capacitors, and the number of wirings are not limited. Meanwhile, the term "pixel" at least refers to a minimum unit for displaying an image, and an organic light emitting display panel displays an image through a plurality of pixels.

An anisotropic conductive film (ACF) according to a first exemplary embodiment will now be described with reference to FIGS. 1 to 4.

Figure 2:
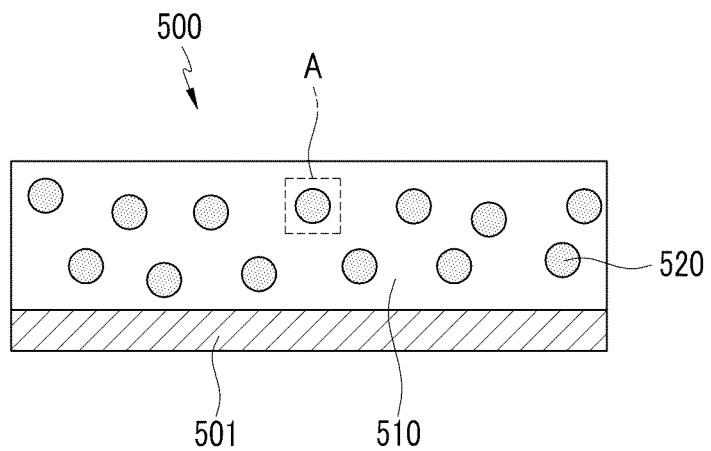
FIG. 2 is a cross-sectional view taken along line II-II in FIG. 1.

FIG. 1 is a perspective view of an anisotropic conductive film (ACF) according to one exemplary embodiment. FIG. 2 is a cross-sectional view taken along line II-II in FIG. 1.

As illustrated in FIGS. 1 and 2, an ACF 500 according to the some exemplary embodiment includes a film 501, an adhesive layer 510, and conductive balls 520.

The film 501 is attached to the adhesive layer 510 and is made of a material having flexibility. The film 501 may be detached from the adhesive layer 510 when an integrated circuit (IC) chip is mounted on a substrate. In more detail, the IC chip may be attached to one exposed surface of the adhesive layer 510 to which the film 510 is not attached, the film 501 may then be detached from the adhesive layer 510, so that the substrate may be subsequently attached to the other surface of the adhesive layer 510 that is exposed as a result of the film 501 being detached. Accordingly, the IC chip is mounted on the substrate.

In a different exemplary embodiment, another film may be attached to the adhesive layer 510 with the adhesive layer 510 interposed therebetween. In this case, the films are attached to both sides of the adhesive layer 510.

The adhesive layer 510 may be made of a resin, and when an IC chip is mounted on the substrate, the substrate and the IC chip are attached to both sides of the adhesive layer 510. The adhesive layer 510 may be melted or hardened by certain means. For example, the adhesive layer 510 may be melted by heat or may be hardened by ultraviolet rays. Namely, the melting qualities and hardening qualities of the adhesive layer 510 may be controlled by using various methods, and the IC chip may be mounted on the substrate by controlling such melting or hardening qualities of the adhesive layer 510.

As shown in FIG. 2, a plurality of conductive balls 520 are dispersed within the adhesive layer 510. The neighboring conductive balls 520 within the adhesive layer 510 are insulated from each other by the adhesive layer 510.

Figure 3:
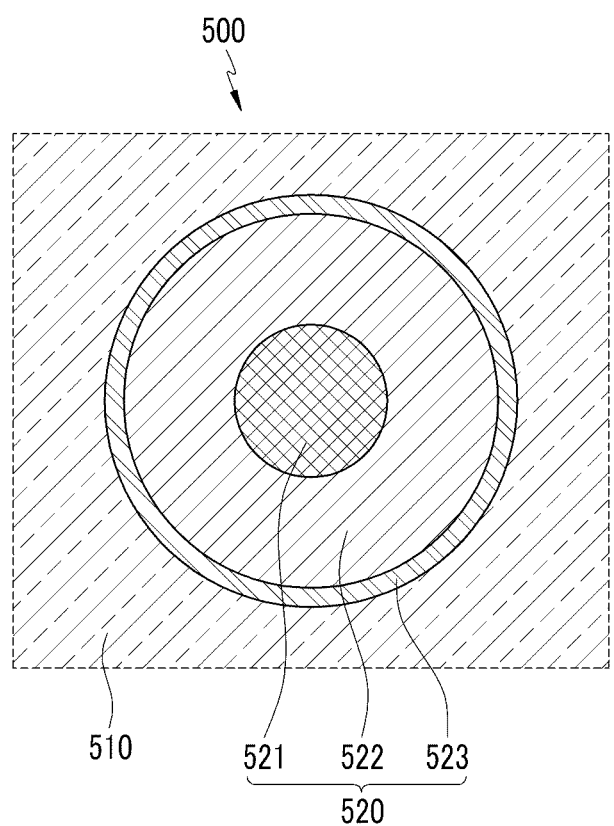
FIG. 3 is an enlarged cross-sectional view of a portion "A" in FIG. 2.

FIG. 3 is an enlarged cross-sectional view of a portion "A" in FIG. 2. The conductive balls 520 may include a first core part 521, a second core part 522, and a conductive part 523, respectively.

The first core part 521 includes rubber, and has a first hardness of about 30 to about 70 as a Shore hardness type A.

FIG. 4 shows the hardness of Shore hardness type A, and as the hardness value of a material becomes smaller, the material is softer. Here, the type A is applied for soft rubber and plastic.

The first core part 521 may have a volume of about 25% to about 50% of the total volume of each conductive ball 520. Preferably, the first hardness of the first core part 521 is about 70 as Shore hardness type A, and in this case, the first core part 521 substantially has a volume of about 30% of the total volume of the conductive ball 520. For example, if the diameter of the conductive ball 520 is about 4 μm, the diameter of the first core part 521 may be about 1 μm.

The present embodiment having the technical features including the limitation in the numerical value of the first core part 521 has certain advantageous aspects, which are described below.

The second core part 522 covers the first core part 521 and contains rubber. The second core part 522 has a second hardness that is greater than the first hardness of the first core part 521.

The conductive part 523 covers the second core part 522 and contains a conductive material. The conductive part 523 may contain one or more of gold (Au), silver (Ag), copper (Cu), and platinum (Pt). The conductive part 523 is positioned at the outermost part of the conductive ball 520, being in direct contact with the adhesive layer 510.

Because the interior of the conductive ball 520 is made of rubber, when pressure is applied thereto, the conductive ball 520 is compressed by the applied pressure and has an elastic restitution force against the direction in which the pressure is applied.

A display device according to an embodiment will now be described with reference to FIGS. 5 to 12. The display device according to this embodiment includes the ACF according to the embodiment of FIGS. 1-3.

Figure 5:
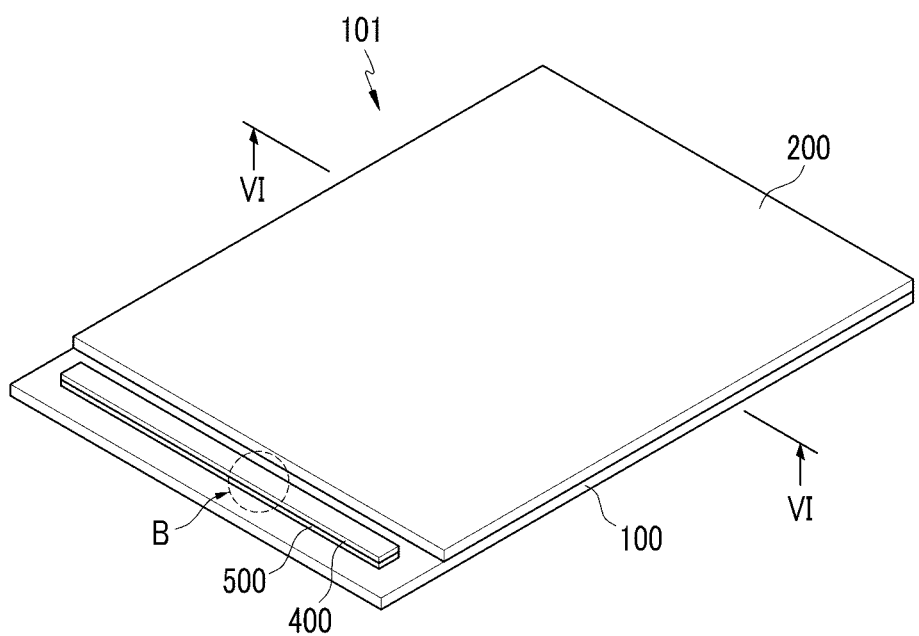
FIG. 5 is a perspective view of a display device according to an embodiment.

FIG. 5 is a perspective view of an embodiment of a display device.

As shown in FIG. 5, the display device includes a wiring substrate 100, an encapsulation substrate 200, a pad part 300 (See FIG. 10), an IC chip 400, and an ACF 500.

The encapsulation substrate 200 is smaller than the wiring substrate 100 and covers the wiring substrate 100. The encapsulation substrate 200 is formed as an insulation substrate made of, for example, glass, quartz, ceramic, plastic, and the like. The encapsulation substrate 200 leaves an edge region of the wiring substrate 100 exposed, and the IC circuit chip 400 is mounted near the encapsulation substrate 200 on the edge region of the wiring substrate 100 with the ACF 500.

Figure 6:
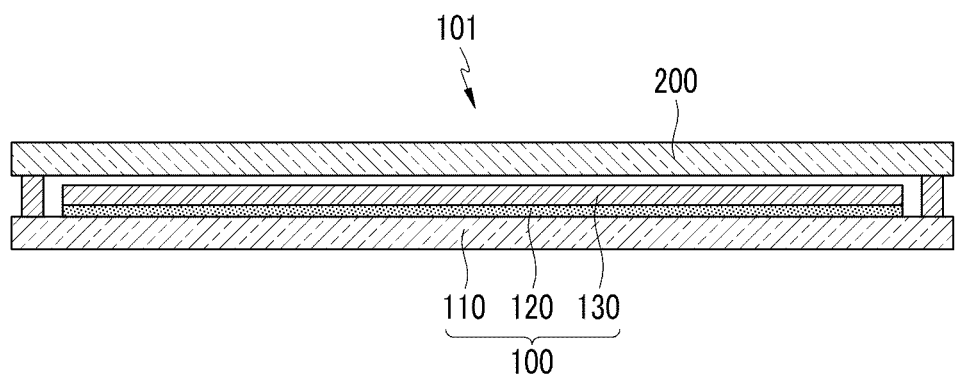
FIG. 6 is a cross-sectional view taken along line VI-VI in FIG. 5.

FIG. 6 is a cross-sectional view taken along line VI-VI in FIG. 5.

As shown in FIG. 6, the wiring substrate 100 includes a substrate main body part 110, a wiring part 120, and an organic light emission element 130.

The substrate main body part 110 is formed as an insulation substrate made of, for example, glass, quartz, ceramic, plastic, or the like. However, the embodiment is not limited thereto, and the substrate main body part 110 may, for example, be formed as a metallic substrate made of stainless steel or the like.

The wiring part 120 and the organic light emission element 130 are positioned between the substrate main body part 110 and the encapsulation substrate 200.

The wiring part 120 includes first and second TFTs 10 and 20 (See FIG. 7), and drives the organic light emission element 130. The organic light emission element 130 emits light according to a drive signal transferred from the wiring part 120.

Figure 7:
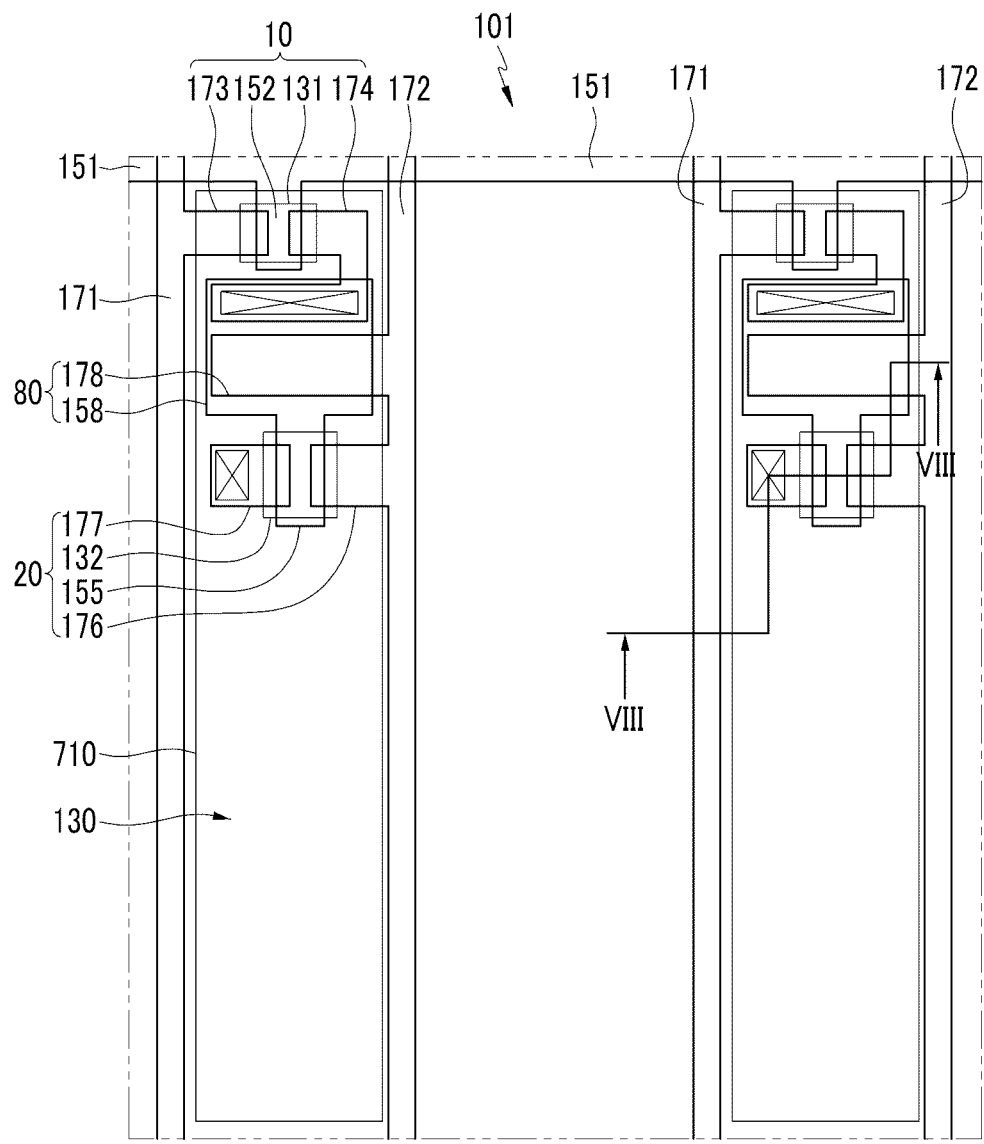
FIG. 7 is a layout view showing the structure of an embodiment of a pixel of the display device.
Figure 8:
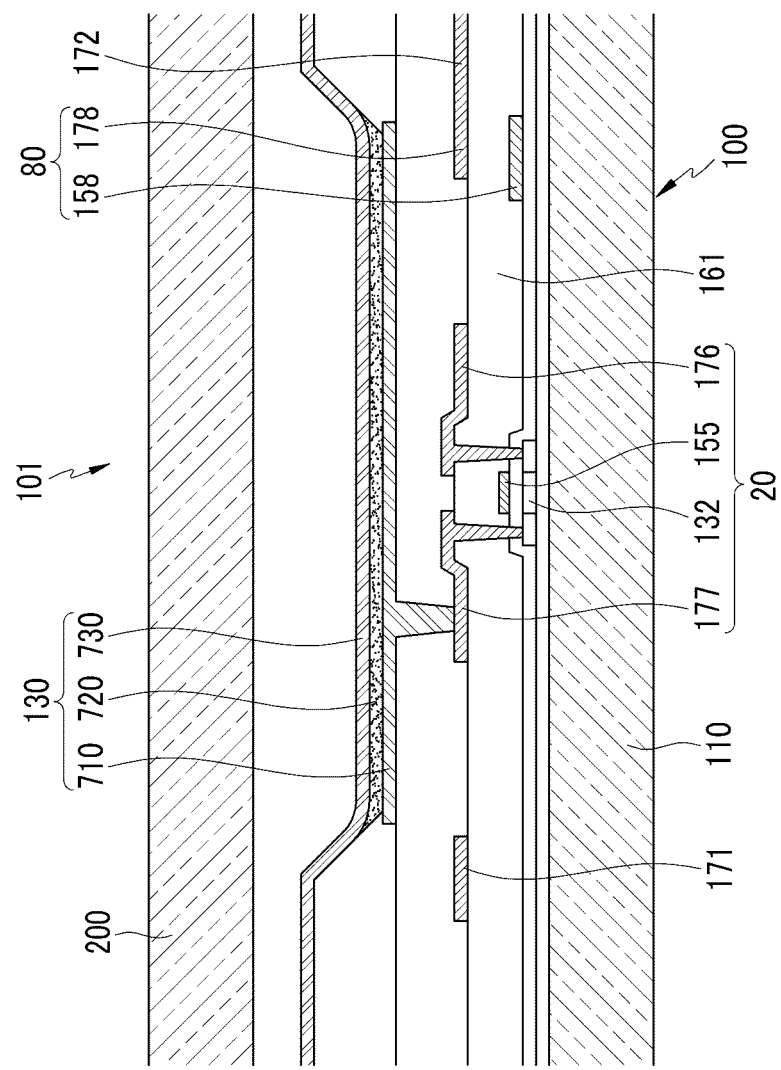
FIG. 8 is a cross-sectional view taken along line VIII-VIII in FIG. 7.

FIGS. 7 and 8 show the detailed structure of an embodiment of the organic light emission element 130 and the wiring part 120, but the structure is not limited to the structure illustrated in FIGS. 7 and 8. The organic light emission element 130 and the wiring part 120 may be formed to have various structures.

The internal structure of an embodiment of the display device 101 will now be described with reference to FIGS. 7 and 8.

FIG. 7 is a layout view showing an embodiment of a structure of a pixel of the display device according FIG. 5. FIG. 8 is a cross-sectional view taken along line VIII-VIII in FIG. 7.

As shown in FIGS. 7 and 8, the display device 101 includes a switching TFT 10, a driving TFT 20, a storage capacitor 80, and the organic light emission element 130 formed at each pixel. Here, the configuration including the switching TFT 10, the driving TFT 20, and the storage capacitor 80 is included in the wiring part 120 of FIG. 6. The wiring part 120 includes a gate line 151 disposed along one direction of the substrate main body part 110, a data line 171 insulatedly crossing the gate line 151, and a common power line 172. Here, a single pixel may be defined as bordered by the gate line 151, the data line 171, and the common power line 172, but the present invention is not limited thereto.

As shown in FIG. 8, the organic light emission element 130 includes a first electrode 710, an organic light emission layer 720 formed on the first electrode 710, and a second electrode 730 formed on the organic light emission layer 720. In this embodiment, the first electrode 710 is a positive (+) electrode, namely, a hole injection electrode, and the second electrode 730 is a negative (−) electrode, namely, an electron injection electrode. However, organic light emission element 130 is not meant to be limited thereto. That is, the first electrode 710 may be a negative electrode and the second electrode may be a positive electrode according to a driving method of the display device 101. Holes and electrons are injected into the organic light emission layer 720 from the first electrode 710 and the second electrode 730, and when exitons formed as the holes and electrodes that have been injected into the organic light emission layer 720 recombined and drop from an excited state to a base state, the organic light emission layer 720 emits light.

In the display device 101 according to FIGS. 5-12, the organic light emission element 130 emits light toward the encapsulation substrate 200. Namely, the organic light emission element 130 is a top emission type of organic light emission element. Here, in order for the organic light emission element 130 to emit light toward the encapsulation substrate 200, the first electrode 710 is made of a light reflective conductive material and the second electrode 730 is made of a light transmissive conductive material.

The storage capacitor 80 includes a pair of storage plates 158 and 178 disposed with an interlayer insulating layer 161 interposed therebetween. Here, the interlayer insulating layer 161 is a dielectric material, and the capacitance of the storage capacitor 80 is determined by the electric charges accumulated in the storage capacitor 80 and the voltage between the storage plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switching element for selecting pixels for emitting light. The switching gate electrode 152 is connected with the gate line 151. The switching source electrode 173 is connected with the data line 171. The switching drain electrode 174 is disposed to be separated from the switching source electrode 173 and connected with storage plate 158.

The driving TFT 20 applies drive power to the first electrode 710 to enable the organic light emission layer 720 of the organic light emission element 130 within a selected pixel to emit light. The driving gate electrode 155 is connected with the storage plate 158 connected with the switching drain electrode 174. The driving source electrode 176 and the other storage plate 178 are connected with the common power line 172, respectively. The driving drain electrode 177 is connected with the first electrode 710 of the organic light emission element 130 via a contact hole.

The switching source electrode 173, the switching drain electrode 174, the driving source electrode 176, and the driving drain electrode 177 are formed on the same layer and made of the same material as that of the pad part 300 (described below). Namely, the switching source electrode 173, the switching drain electrode 174, the driving source electrode 176, and the driving drain electrode 177 are formed through the same process.

With such a structure, the switching TFT 10 is operated by a gate voltage applied to the gate line 151 to transfer a data voltage applied to the data line 171, to the driving TFT 20. The voltage corresponding to the difference between a common voltage applied from the common power line 172 to the driving TFT 20 and the data voltage transferred from the TFT 10 is stored in the storage capacitor 80, and current corresponding to the voltage stored in the storage capacitor 80 flows to the organic light emission element 130 through the driving TFT 20 to make the organic light emission element 130 emit light.

Figure 9:
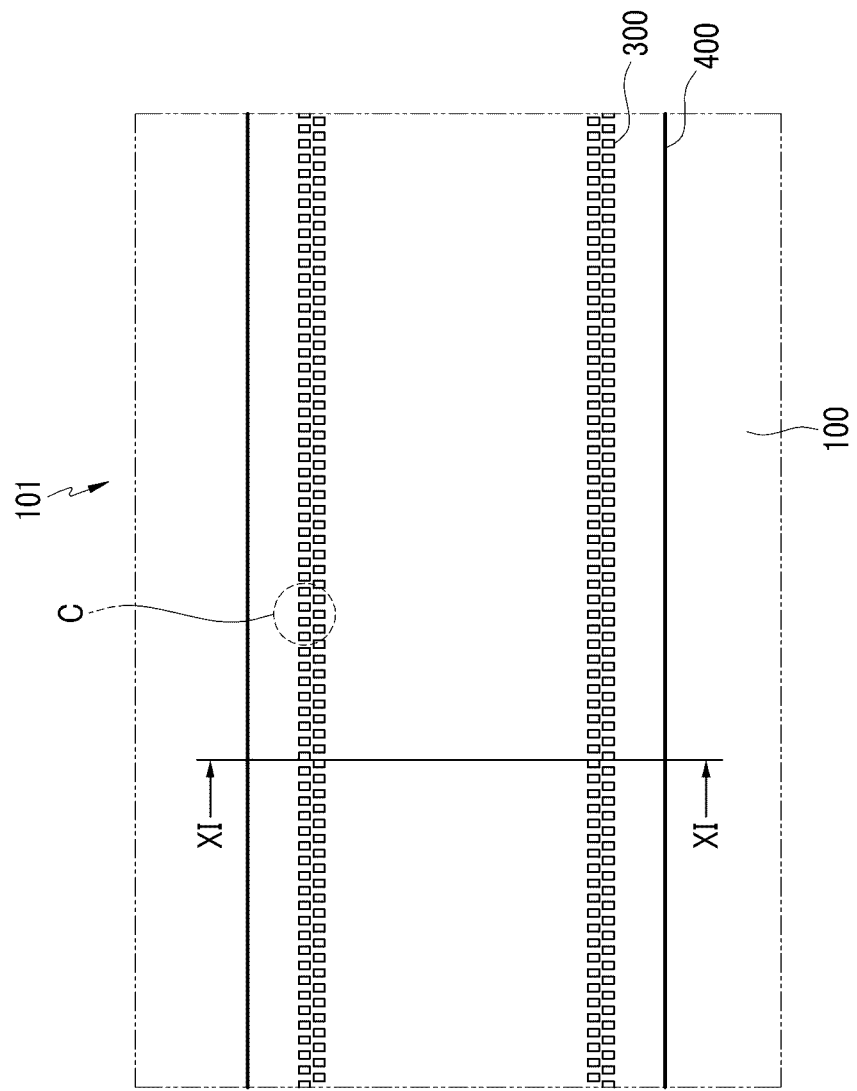
FIG. 9 is an enlarged top plan view of a portion "B" in FIG. 5.
Figure 10:
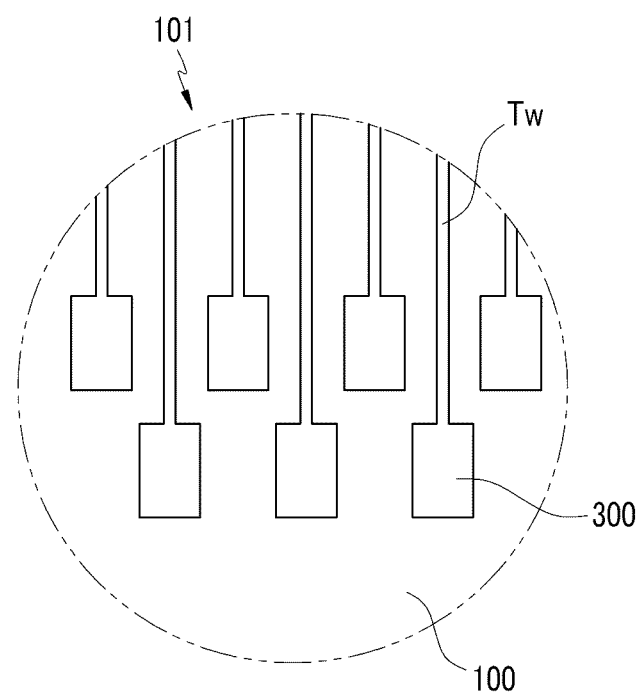
FIG. 10 is an enlarged top plan view of a portion "C" in FIG. 9.

FIG. 9 is an enlarged top plan view of a portion "B" in FIG. 5. FIG. 10 is an enlarged top plan view of a portion "C" in FIG. 9.

As shown in FIGS. 9 and 10, the pad part 300 is connected with a thin film wiring Tw extending from the wiring part 120. The thin film wiring Tw connects the pad part 300 to the pixels. The pad part 300 is positioned such that it corresponds to the IC chip 400, and is connected with the IC chip 400 by means of the ACF 500.

Figure 11:
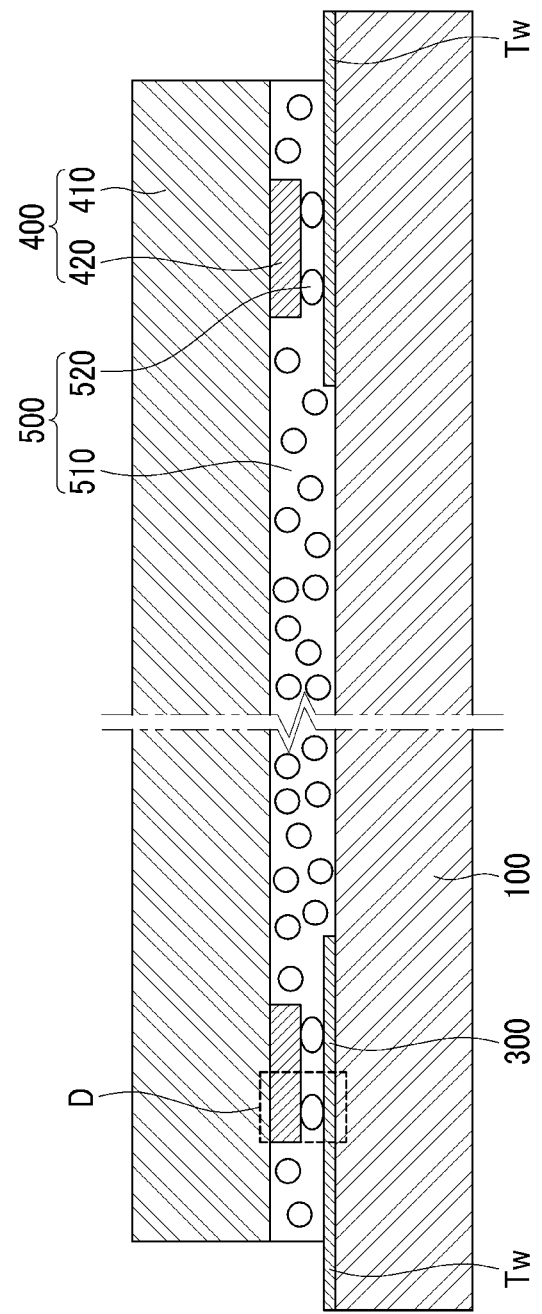
FIG. 11 is a cross-sectional view taken along line XI-XI in FIG. 9.
Figure 12:
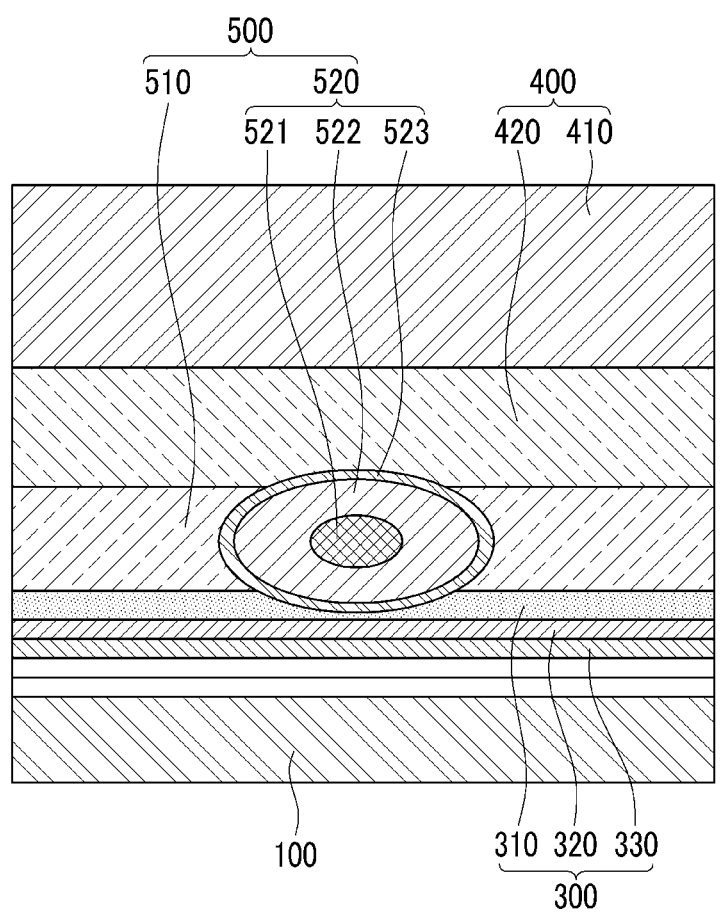
FIG. 12 is an enlarged cross-sectional view of a portion "D" in FIG. 11.

FIG. 11 is a cross-sectional view taken along line XI-XI in FIG. 9. FIG. 12 is an enlarged cross-sectional view of a portion "D" in FIG. 11.

As shown in FIGS. 11 and 12, the pad part 300 extends from the wiring part 120 by the thin film wiring Tw, and is made of, for example, the same material as that of the switching source electrode 173, the switching drain electrode 174, the driving source electrode 176, and the driving drain electrode 177 of the wiring part 120. The pad part 300 includes a first layer 310, a second layer 320, and a third layer 330. The first layer 310 may contain titanium (Ti), the second layer 320 may contain aluminum (Al), and the third layer 330 may contain titanium (Ti). Namely, the pad part 300 includes the plurality of layers, and among the plurality of layers, the first layer 310 is in contact with the conductive ball 520 and may contain titanium (Ti).

In a different exemplary embodiment, the material of the pad part 300 is not limited, and the pad part 300 may be made of any material and is the same as that of the source electrode and the drain electrode constituting the TFT.

The IC chip 400 includes a circuit chip main body part 410 and a connection terminal 420 extending from the circuit chip main body part 410 so as to be connected with the pad part 300. The IC chip 400 connected with the pad part 300 controls light emission of the organic light emission element 130. In more detail, the IC chip 400 is connected with the pad part 300 by means of the ACF 500, and transfers a signal to the switching source electrode 173 and the driving source electrode 176 to enable the organic light emission layer 720 to emit light. The connection terminal 420 of the IC chip 400 is connected with the pad part 300 by means of the conductive balls 520 of the ACF 500.

The ACF 500 connecting the IC chip 400 and the pad part 300 serves to mount the IC chip 400 on the wiring substrate 100. The ACF 500 includes the adhesive layer 510 and the conductive balls 520.

The adhesive layer 510 is positioned between the IC chip 400 and the wiring substrate 100 to attach the IC chip 400 and the wiring substrate 100. The plurality of conductive balls 520 are positioned within the adhesive layer 510, and the adhesive layer 510 prevents a short circuit of neighboring conductive balls 520.

The conductive balls 520 are dispersed in the adhesive layer 510, and among the plurality of conductive balls 520, a conductive ball 520 positioned between the connection terminal 420 of the IC chip 400 and the pad part 300 directly connects the connection terminal 420 and the pad part 300. As described above, the conductive ball 520 includes the first core part 521, the second core part 522, and the conductive part 523. The conductive ball 520 positioned between connection terminal 420 of the IC chip 400 and the first layer 310 of the pad part 300 is compressed by being pinched by the connection terminal 420 and the first layer 310, and is in a state of applying a contact pressure toward the connection terminal 420 and the first layer 310 by its elastic restitution quality. Accordingly, the conductive part 523 is directly in contact with the pad part 300 and the connection terminal 420 of the IC chip 400.

Here, the contact pressure by the conductive ball 520 refers to the elastic restitution force generated from the conductive ball 520 according to the pressure applied to the conductive ball 520.

The conductive part 523 of the conductive ball 520 in contact with the connection terminal 420 and the first layer 310 presses into the connection terminal 420 and the first layer 310 to form a recess in each of the connection terminal 420 and the first layer 310, and is in surface-contact with each of the connection terminal 420 and the first layer 310.

Accordingly, in the display device 101, the conductive ball 520 is in surface-contact with each of the connection terminal 420 and the pad part 300 and applies contact pressure toward the connection terminal 420 and the pad part 300, thus minimizing contact resistance between the connection terminal 420 and the conductive ball 520 and between the pad part 300 and the conductive ball 520. Namely, because the contact resistance between the IC chip 400 and the pad part 300 is minimized, conductivity of electrons between the IC chip 400 and the pad part 300 increases.

Some beneficial aspects of the ACF 500 and the display device 101 will now be described with reference to FIGS. 13 to 15.

Figure 14:
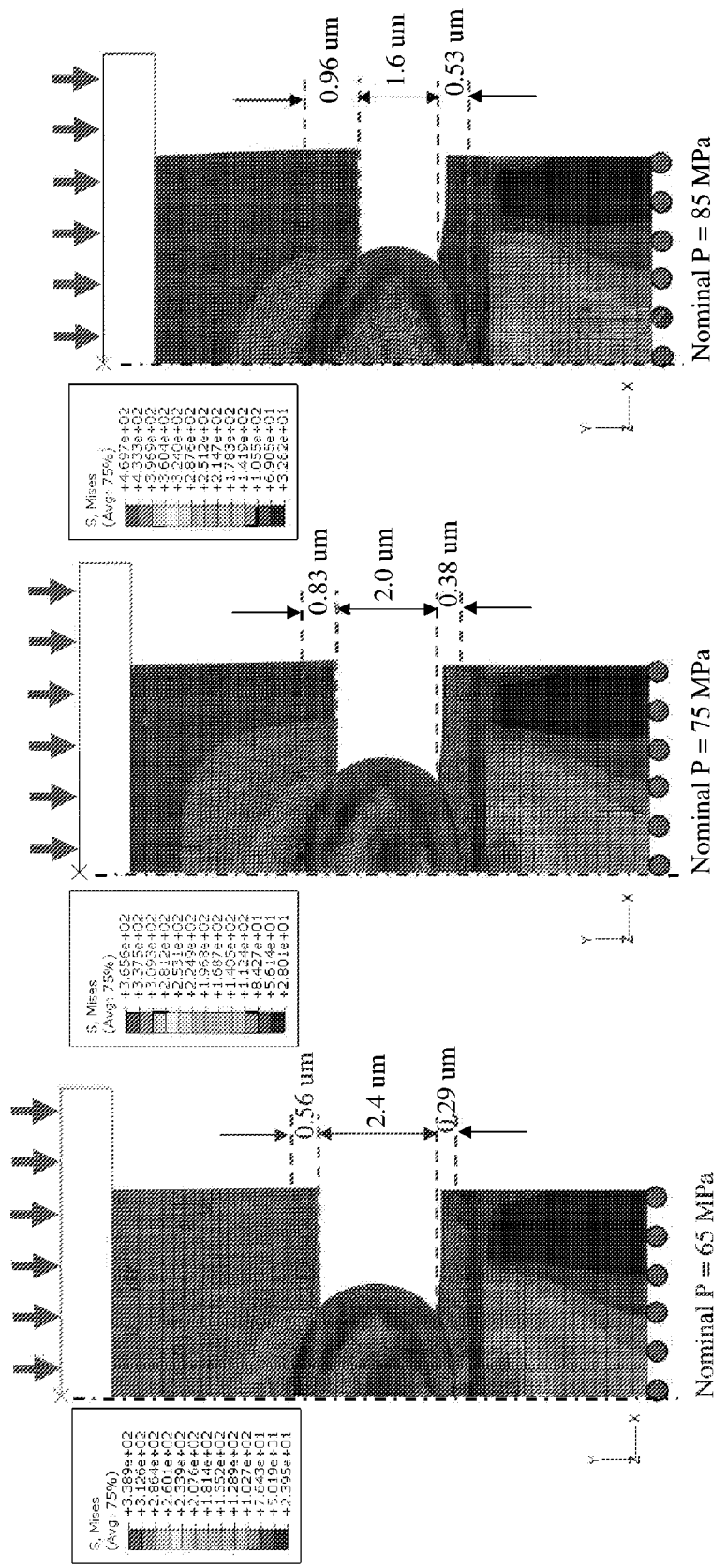

FIGS. 13 to 15 show results of experimentation and simulation using a conventional conductive ball.

First, FIG. 13 illustrates experimental data obtained by measuring deformation of the conventional conductive ball, the pad part 300, and the connection terminal 420 when the IC chip 400 is adhesively mounted on the wiring substrate 100 by using an ACF including the conventional conductive ball, while changing the adhesion pressure in an environment in which the temperature was 210 degrees Celsius.

As shown in FIG. 13, the experiment was performed with adhesion pressures of 65 MPa, 75 MPa, and 85 MPa. The deformation depths of the conventional conductive ball, the pad part 300, and the connection terminal 420 were measured according to the respective contact pressures as shown in a Table in FIG. 13. In the Table, "δ" is the distance between the pad part 300 and the connection terminal 420, "bump" is the depth of the recess of the connection terminal 420 formed by the conventional conductive ball, and "pad" is the depth of the recess of the pad part 300 formed by the conventional conductive ball.

As shown in the Table in FIG. 13, it is noted that because the contact pressure and the elastic restitution of the conventional conductive ball exceeds the limit of the fixing capability of the adhesive layer 510, at the adhesion pressure of 75 MPa to 85 MPa, the adhesive layer 510 fails to hold the compressed state of the conventional conductive ball, resulting in the distance (δ) between the pad part 300 and the connection terminal 420 being greater when the pressure was 85 MPa than when the pressure was 75 MPa.

The fact that the conventional conductive ball was more compressed when the adhesion pressure was 85 MPa, compared with the case where the adhesion pressure was 75 MPa, can be recognized upon noticing the depth (bump, pad) of the recess formed on the connection terminal 420 and the pad part 300 by the conventional conductive ball. In Table in FIG. 13, it is noted that when the adhesion pressure is 85 MPa, the depth of the recess formed on the connection terminal 420 and the pad part 300 by the conventional conductive ball is larger compared with the case where the adhesion pressure is 75 MPa.

FIG. 14 shows a simulation of the phenomenon by using ABAQUS, a structure/electricity/heat interpretation tool, SIMULIA, of Dassault Systemes.

FIG. 14 shows the deformation of the connection terminal 420, the conventional conductive ball, and the pad part 300 at the adhesion pressures of 65 MPa to 85 MPa. As shown in FIG. 14, in the case of the simulation using the ABAQUS tool, the setting in which the adhesive layer 510 cannot hold the compressed state of the conventional conductive ball at more than a certain pressure is not included in the ABAQUS tool results. Accordingly, it is noted that the conventional conductive ball is further compressed at the adhesion pressure of 85 MPa, shortening the distance between the connection terminal 420 and the pad part 300.

FIG. 15 shows a table obtained from a simulation using the ABAQUS tool and a table measured from experimentation. Here, "δ" is the distance between the pad part 300 and the connection terminal 420, "bump" is the depth of the recess of the connection terminal 420 formed by the conventional conductive ball, and "pad" is the depth of the recess of the pad part 300 formed by the conventional conductive ball.

As shown in FIG. 15, when the adhesion pressure is 85 MPa, δ is 2.0 μm in the case of the experimentation and 1.6 μm in case of the simulation. When they are compared, it is confirmed that the conventional conductive ball was restored into its original shape by about 0.4 μm at the 75 MPa to 85 MPa pressure. As the adhesion pressure increases, the contact pressure between the conventional conductive ball and the pad part 300 increases due to the elastic restitution of the conventional conductive ball, and it is noted from the simulation and the experimentation results that the fixing capability of the adhesive layer 510 restraining the restoration of the conventional conductive ball owing to the elastic restitution is insufficient when the adhesion pressure is 85 MPa.

Namely, as the adhesion pressure increases, the contact pressure between the conventional conductive ball and the pad part 300 increases to further compress the conventional conductive ball. As the conventional conductive ball is compressed, the contact pressure of the interface between the conventional conductive ball and the pad part 300 increases while the contact resistance between the conventional conductive ball and the pad part 300 decreases. However, because the stress at the central portion of the conventional conductive ball increases according to the increase in the pressure applied to the conventional conductive ball, the elastic restitution of the conventional conductive ball increases.

If the contact pressure is large while the stress at the central portion of the conventional conductive ball is small, the elastic restitution of the conductive ball would non-linearly correspond to the pressure applied to the conductive ball.

To take advantage of this fact, the first core part 521 of the conductive ball 520 is configured to have the volume of about 25% to about 50% of the total volume of the conductive ball 520 while having the hardness of about 30 to about 70 as the Shore hardness type A, in order to reduce the stress at the central portion of the conductive ball 520 as much as possible.

That is, the central portion of the conductive ball 520 includes first and second core parts 521 and 522, where the second core part 522 is harder than the first core part 521.

Figure 16:
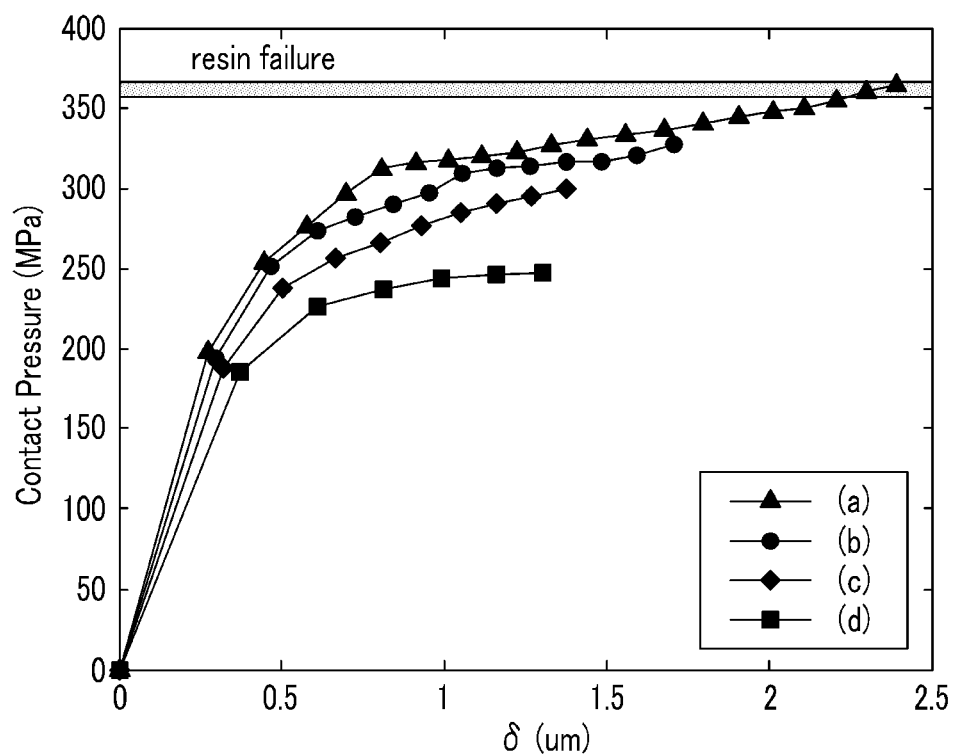
FIG. 16 is a graph showing the results of experimentation.

In order to confirm the effect of such configuration, experimentation was performed. FIG. 16 is a graph showing the results of the experimentation performed.

The graph of FIG. 16 shows the contact pressure by the conductive ball 520 based on the distance (δ) between the pad part 300 and the connection terminal 420 which is shortened according to the adhesion pressure applied to the conductive ball 520.

In FIG. 16, the x axis is the distance (δ) between the pad part 300 and the connection terminal 420, the y axis is the contact pressure by the conductive ball 520, and (a), (b), (c), and (d) indicate individual conductive balls.

(a) is a curved line corresponding to the conventional conductive ball as a comparative example. As noted with the curved line (a), it is noted that the contact pressure of the conventional conductive ball increases according to the adhesion pressure applied to the conductive ball. Regarding the curved line (a), when a contact pressure due to the conductive ball is about 350 MPa, the fixing of the adhesive layer 510 with respect to the conductive ball fails (resin failure).

(b) is a curved line of the conductive ball 520 including the first core part 521 having a first hardness of about 60 as the Shore hardness type A and having a volume of about 25% of the total volume of the conductive ball 520.

(c) is a curved line of the conductive ball 520 including the first core part 521 having a first hardness of about 60 as the Shore hardness type A and having a volume of about 38% of the total volume of the conductive ball 520.

(d) is a curved line of the conductive ball 520 including the first core part 521 having a first hardness of about 60 as the Shore hardness type A and having a volume of about 50% of the total volume of the conductive ball 520.

As noted with the curved lines (b), (c), and (d) of the graph, even if the adhesion pressure increases, because the first core part 521, the center of the conductive ball 520, is soft, the contact pressure by the conductive ball 520 increases gradually compared with the contact pressure by the conventional conductive ball. In this case, the distance between the pad part 300 and the connection terminal 420 is continuously shortened. Namely, in the experiment, because the first core part 521, that is, the center of the conductive ball 520, is soft compared with the conventional conductive ball, the contact pressure, an elastic restitution, generated by the adhesion pressure applied to the conductive ball 520 increases gradually, compared with the conventional conductive ball. Thus, because the contact pressure by the conductive ball 520 increases gradually, the distance between the connection terminal 520 and the pad part 300 is shortened in a state that the adhesive layer 510 fixes holds restoration of the conductive ball 520.

That is, in the experiment, as the adhesion pressure with respect to the conductive ball 520 increases, the conductive ball 520 is further compressed, shortening the distance between the connection terminal 520 and the pad part 300, which leads to the increase in the contact surface between the conductive ball 520 and the connection terminal 420 and the contact surface between the conductive ball 520 and the pad part 300. In this case, because the first core part 521, the center of the conductive ball 520, is soft, the elastic restitution by the conductive ball 520, increases gradually so as to not exceed the limit of the holding capability of the adhesive layer 510 that holds the conductive ball 520. As a result, the electron conductivity between the IC chip 400 and the pad part 300 increases, and a short circuit between the IC chip 400 and the pad part 300 is prevented.

As described above, the ACF 500 according to some exemplary embodiments and the display device 101 having the ACF 500 according some exemplary embodiments hold the compressed form of the conductive ball 520 to thus minimize the contact resistance between the wiring substrate 100 and the IC chip 400.

An ACF according to a another exemplary embodiment and a display device having the ACF are described with reference to FIGS. 17 and 18.

Figure 17:
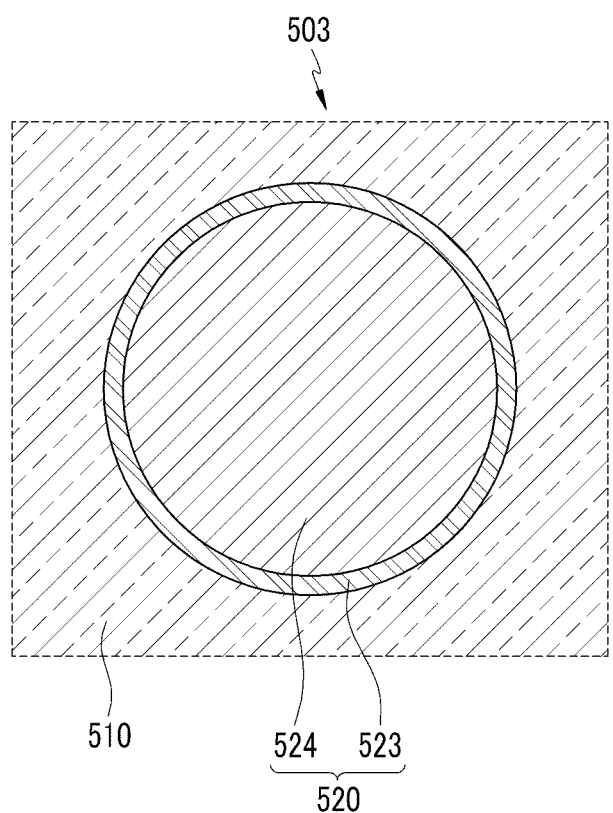
FIG. 17 is an enlarged cross-sectional view of a portion of an ACF according to an embodiment.

FIG. 17 is an enlarged cross-sectional view of a portion of an ACF according to a another exemplary embodiment. FIG.

18 is an enlarged cross-sectional view of a portion of a display device according to some embodiments.

Figure 18:
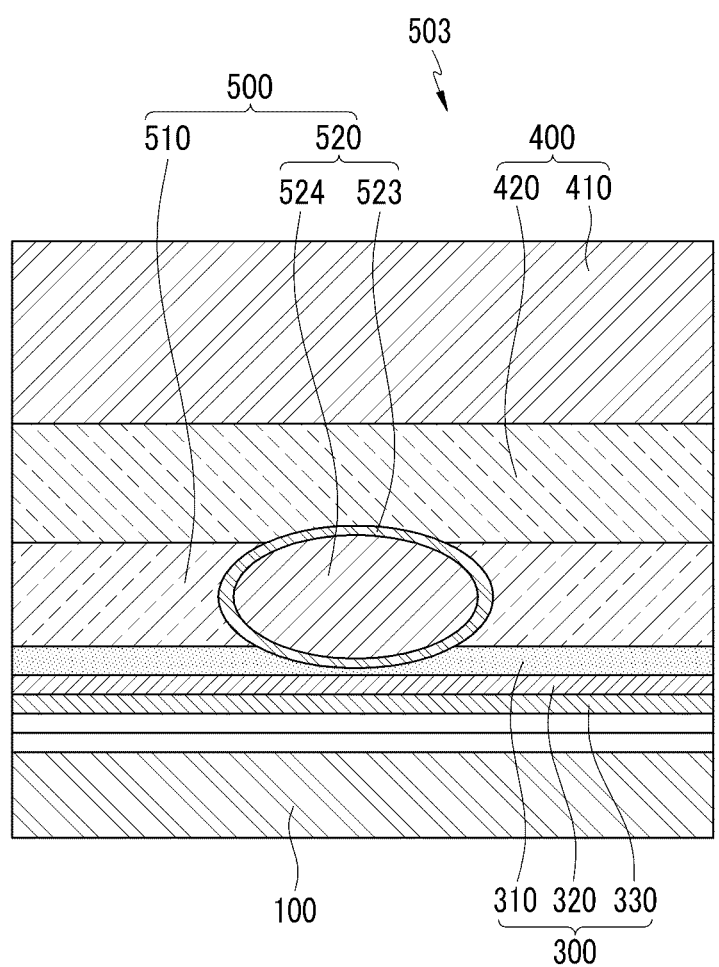
FIG. 18 is an enlarged cross-sectional view of a portion of a display device according to an embodiment.

As shown in FIGS. 17 and 18, the conductive ball 520 of an ACF 503 includes a third core part 524 and the conductive part 523.

The third core part 524 contains rubber and has a hardness of about 30 to about 70 as Shore hardness type A. The conductive part 523 covers the third core part 524.

The conductive ball 520 positioned between the connection terminal 420 of the IC chip 400 and the first layer 310 of the pad part 300 is compressed by being pressurized by the connection terminal 420 and the first layer 310, and applies a contact pressure toward the connection terminal 420 and the first layer 310 by its elastic restitution. The conductive part 523 is directly in contact with the pad part 300 and the connection terminal 420 of the IC chip 400.

Because the third core part 524, the center of the conductive ball 520, is soft, the contact pressure of the conductive ball 520 does not exceed the limit of the fixing capability of the adhesive layer 510 that fixes the conductive ball 520. Accordingly, the adhesive layer 510 still holds (or fixes) the conductive ball 520, and the contact resistance between the conductive ball 520 and the pad part 300 and that between the conductive ball 520 and the connection terminal 420 are minimized, whereby the electron conductivity between the IC chip 400 and the pad part 300 increases and a short circuit between the IC chip 400 and the pad part 300 can be prevented.

As described above, the ACF 503 and the display device 102 having the ACF 503 hold the compressed form of the conductive ball 520 to thus minimize the contact resistance between the wiring substrate 100 and the IC chip 400.

While this disclosure has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An anisotropic conductive film (ACF) comprising:
a film;
an adhesive layer on the film; and
one or more conductive balls within the adhesive layer,
wherein each of the conductive balls comprises:
a first core part which comprises rubber, the first core part having a first hardness between about 30 to about 70 as Shore hardness type A, wherein the first core part has a volume of about 25% to about 50% of a volume of the conductive ball;
a second core part which comprises rubber, the second core part covering the first core part and having a second hardness that is greater than the first hardness; and
a conductive part covering the second core part.

2. The anisotropic conductive film of claim 1, wherein the first hardness is about 70 as Shore hardness type A, and the first core part has a volume of about 30% of the entire volume of the conductive ball.

3. The anisotropic conductive film of claim 1, wherein the diameter of the conductive balls is about 4 µm, and the diameter of the first core part is about 1 µm.

4. A display device comprising:
a wiring substrate having a wiring part;
a pad part on the wiring substrate, the pad part extending from the wiring part;
an integrated circuit (IC) chip connected with the pad part; and
an anisotropic conductive film (ACF) mounting the IC chip to the pad part, wherein the ACF comprises an adhesive layer positioned between the pad part and the IC chip and one or more conductive balls within the adhesive layer and connecting the pad part to the IC chip,
wherein each of the conductive balls comprises:
a first core part which comprises rubber, the first core part having a first hardness between about 30 to about 70 as Shore hardness type A, wherein the first core part has a volume of about 25% to about 50% of a volume of the conductive ball;
a second core part which comprises rubber, the second core part covering the first core part and having a second hardness that is greater than the first hardness; and
a conductive part covering the second core part.

5. The display device of claim 4, wherein the pad part comprises a plurality of layers, and a layer contacting the conductive ball comprises titanium (Ti).

6. The display device of claim 4, wherein the first hardness is about 70 as Shore hardness type A, and the first core part has a volume of about 30% of the entire volume of the conductive ball.

7. The display device of claim 4, wherein the diameter of the conductive balls is about 4 µm, and the diameter of the first core part is about 1 µm.

8. The display device of claim 4, wherein the IC chip comprises:
a circuit chip main body part; and
a connection terminal extending from the circuit chip main body and connected with the pad part,
wherein the conductive balls contact the connection terminal and the pad part.

9. The display device of claim 8, wherein the conductive balls are compressed between the pad part and the connection terminal.

10. The display device of claim 9, wherein the wiring part comprises source and drain electrodes forming a thin film transistor (TFT), and the pad part is made of the same material as that of the source and drain electrodes.

11. The display device of claim 10, wherein the wiring substrate comprises:
a first electrode electrically connected with the drain electrode;
an organic light emission layer positioned on the first electrode; and
a second electrode positioned on the organic light emission layer.

12. The display device of claim 11, further comprising an encapsulation substrate having a width less than a width of the wiring substrate, wherein the IC chip is mounted at an edge region of the wiring substrate.

\* \* \* \* \*